(12) United States Patent  (10) Patent No.: US 7,522,329 B2
Brabec et al.  (45) Date of Patent: Apr. 21, 2009

(54) DISPLAYS WITH INTEGRATED PHOTOVOLTAIC CELLS

(75) Inventors: Christoph Brabec, Linz (AT); Randolph W. Chan, Lexington, MA (US); Richard Childers, Dracut, MA (US); Daniel Patrick McGahn, Boston, MA (US); Kevin P. Oliver, Reading, MA (US)

(73) Assignee: Konarka Technologies, Inc., Lowell, MA (US)

( * ) Notice: Subject to any disclaimer, the term of this patent is extended or adjusted under 35 U.S.C. 154(b) by 0 days.

(21) Appl. No.: 11/508,035

(22) Filed: Aug. 22, 2006

(65) Prior Publication Data

US 2007/0115399 A1 May 24, 2007

Related U.S. Application Data

(60) Provisional application No. 60/722,885, filed on Sep. 30, 2005, provisional application No. 60/710,183, filed on Aug. 22, 2005.

(51) Int. Cl.
*G02F 1/15* (2006.01)

(52) U.S. Cl. ...................................................... 359/265

(58) Field of Classification Search ......... 359/265–275, 359/296; 349/27; 345/87
See application file for complete search history.

(56) References Cited

U.S. PATENT DOCUMENTS

| | | | |
|---|---|---|---|
| 3,037,122 A | 5/1962 | Strother | |
| 3,069,487 A | 12/1962 | Strother | |
| 3,206,831 A | 9/1965 | Strother | |
| 3,206,832 A | 9/1965 | Strother | |
| 3,679,949 A | 7/1972 | Uekusa et al. | |
| 3,872,047 A | 3/1975 | Jandourek | |
| 3,969,163 A | 7/1976 | Wakefield | |
| 3,984,256 A | 10/1976 | Fletcher et al. | |
| 4,080,488 A | 3/1978 | Chen et al. | |
| 4,232,108 A | 11/1980 | Dessauer | |
| 4,243,432 A | 1/1981 | Jordan et al. | |
| 4,295,329 A | 10/1981 | Windley | |
| 4,385,102 A | 5/1983 | Fitzky et al. | |
| 4,436,558 A | 3/1984 | Russak | |
| 4,492,743 A | 1/1985 | Howe | |
| 4,500,880 A | 2/1985 | Gomersall et al. | |
| 4,589,194 A | 5/1986 | Roy | |
| 4,684,537 A | 8/1987 | Graetzel et al. | |
| 4,821,291 A | 4/1989 | Stevens et al. | |
| 4,872,925 A | 10/1989 | McMaster | |
| 4,913,744 A | 4/1990 | Hoegl et al. | |
| 4,927,721 A | 5/1990 | Gratzel et al. | |
| 4,937,586 A | 6/1990 | Stevens et al. | |
| 4,962,466 A | 10/1990 | Revesz et al. | |
| 4,985,632 A * | 1/1991 | Bianco et al. ............... 250/372 |
| 5,084,365 A | 1/1992 | Gratzel et al. | |
| 5,160,920 A * | 11/1992 | Harris ......................... 345/52 |

(Continued)

FOREIGN PATENT DOCUMENTS

DE 198 22 024 A 11/1999

(Continued)

*Primary Examiner*—Hung X Dang
*Assistant Examiner*—Tuyen Q Tra
(74) *Attorney, Agent, or Firm*—Fish & Richardson P.C.

(57) ABSTRACT

Displays with integrated photovoltaic cells, as well as related systems, components, and methods, are disclosed.

30 Claims, 4 Drawing Sheets

U.S. PATENT DOCUMENTS

| | | | |
|---|---|---|---|
| 5,178,685 A | 1/1993 | Borenstein et al. | |
| 5,248,349 A | 9/1993 | Foote et al. | |
| 5,273,911 A | 12/1993 | Sasaki et al. | |
| 5,288,337 A * | 2/1994 | Mitchell | 136/246 |
| 5,331,183 A | 7/1994 | Sariciftci et al. | |
| 5,343,519 A | 8/1994 | Feldman | |
| 5,350,459 A * | 9/1994 | Suzuki et al. | 136/263 |
| 5,350,644 A | 9/1994 | Graetzel et al. | |
| 5,385,614 A | 1/1995 | Albright et al. | |
| 5,437,736 A | 8/1995 | Cole | |
| 5,441,827 A | 8/1995 | Gratzel et al. | |
| 5,454,879 A | 10/1995 | Bolger | |
| 5,454,880 A | 10/1995 | Sariciftci et al. | |
| 5,463,057 A | 10/1995 | Graetzel et al. | |
| 5,474,621 A | 12/1995 | Barnard | |
| 5,482,570 A | 1/1996 | Saurer et al. | |
| 5,502,463 A | 3/1996 | Sasaki et al. | |
| 5,525,440 A | 6/1996 | Kay et al. | |
| 5,548,282 A | 8/1996 | Escritt et al. | |
| 5,569,561 A | 10/1996 | Exnar et al. | |
| 5,637,156 A | 6/1997 | Kubota et al. | |
| 5,641,362 A | 6/1997 | Meier | |
| 5,728,487 A | 3/1998 | Gratzel et al. | |
| 5,751,257 A | 5/1998 | Sutherland | |
| 5,789,592 A | 8/1998 | Gratzel | |
| 5,830,597 A | 11/1998 | Hoffmann et al. | |
| 5,869,206 A | 2/1999 | Sotomura | |
| 5,881,083 A | 3/1999 | Diaz-Garcia et al. | |
| 5,885,368 A | 3/1999 | Lupo et al. | |
| 5,902,416 A | 5/1999 | Kern et al. | |
| 5,906,004 A | 5/1999 | Lebby et al. | |
| 5,986,206 A | 11/1999 | Kambe et al. | |
| 6,013,871 A | 1/2000 | Curtin | |
| 6,024,807 A | 2/2000 | Pappas et al. | |
| 6,043,428 A | 3/2000 | Han et al. | |
| 6,067,184 A | 5/2000 | Bonhote et al. | |
| 6,067,313 A | 5/2000 | Cafarella et al. | |
| 6,069,313 A | 5/2000 | Kay | |
| 6,075,203 A | 6/2000 | Wang et al. | |
| 6,080,690 A | 6/2000 | Lebby et al. | |
| 6,084,176 A | 7/2000 | Shiratsuchi et al. | |
| 6,121,540 A | 9/2000 | Takeda et al. | |
| 6,130,378 A | 10/2000 | Hatano et al. | |
| 6,175,075 B1 | 1/2001 | Shiotsuka et al. | |
| 6,232,547 B1 | 5/2001 | Meissner et al. | |
| 6,239,355 B1 | 5/2001 | Salafsky | |
| 6,245,988 B1 | 6/2001 | Gratzel et al. | |
| 6,278,056 B1 | 8/2001 | Sugihara et al. | |
| 6,281,429 B1 | 8/2001 | Takada et al. | |
| 6,288,324 B1 | 9/2001 | Komori et al. | |
| 6,288,325 B1 | 9/2001 | Jansen et al. | |
| 6,288,326 B1 | 9/2001 | Hayashi et al. | |
| 6,291,763 B1 | 9/2001 | Nakamura | |
| 6,310,282 B1 | 10/2001 | Sakurai et al. | |
| 6,319,747 B1 | 11/2001 | Todisco et al. | |
| 6,335,480 B1 | 1/2002 | Bach et al. | |
| 6,350,946 B1 | 2/2002 | Miyake et al. | |
| 6,355,125 B1 * | 3/2002 | Tahon et al. | 156/99 |
| 6,376,765 B1 | 4/2002 | Wariishi et al. | |
| 6,384,321 B1 | 5/2002 | Mikoshiba et al. | |
| 6,426,827 B1 | 7/2002 | Bonhote et al. | |
| 6,441,297 B1 | 8/2002 | Keller et al. | |
| 6,444,189 B1 | 9/2002 | Wang et al. | |
| 6,469,243 B2 | 10/2002 | Yamanaka et al. | |
| 6,538,194 B1 | 3/2003 | Koyanagi et al. | |
| 6,556,515 B1 * | 4/2003 | Sekiguchi | 368/242 |
| 6,580,026 B1 | 6/2003 | Koyanagi et al. | |
| 6,580,027 B2 | 6/2003 | Forrest et al. | |
| 6,657,119 B2 | 12/2003 | Lindquist et al. | |
| 6,664,623 B1 | 12/2003 | Phani et al. | |
| 6,706,963 B2 | 3/2004 | Gaudiana et al. | |
| 6,858,158 B2 | 2/2005 | Chittibabu et al. | |
| 7,196,834 B2 * | 3/2007 | Brabec et al. | 359/245 |
| 7,351,907 B2 * | 4/2008 | Gaudiana et al. | 136/263 |
| 2001/0004901 A1 | 6/2001 | Yamanaka et al. | |
| 2001/0027806 A1 | 10/2001 | Yamanaka et al. | |
| 2001/0032665 A1 | 10/2001 | Han et al. | |
| 2002/0042343 A1 | 4/2002 | Akui et al. | |
| 2002/0116330 A1 | 8/2002 | Hed et al. | |
| 2002/0150613 A1 | 10/2002 | Govil et al. | |
| 2003/0021566 A1 | 1/2003 | Shustack et al. | |
| 2003/0056821 A1 | 3/2003 | Chittibabu et al. | |
| 2003/0127130 A1 | 7/2003 | Murai et al. | |
| 2003/0140959 A1 | 7/2003 | Gaudiana et al. | |
| 2003/0145885 A1 | 8/2003 | Kang et al. | |
| 2003/0164188 A1 | 9/2003 | Murai et al. | |
| 2003/0188776 A1 | 10/2003 | Li et al. | |
| 2003/0188777 A1 | 10/2003 | Gaudiana et al. | |
| 2003/0189402 A1 | 10/2003 | Gaudiana et al. | |
| 2003/0192583 A1 | 10/2003 | Ryan | |
| 2003/0192584 A1 | 10/2003 | Beckenbaugh et al. | |
| 2003/0192585 A1 | 10/2003 | Beckenbaugh et al. | |
| 2003/0196692 A1 | 10/2003 | Koyanagi et al. | |
| 2003/0230337 A1 | 12/2003 | Gaudiana et al. | |
| 2004/0025933 A1 | 2/2004 | Chittibabu et al. | |
| 2004/0025934 A1 | 2/2004 | Chittibabu et al. | |
| 2004/0031520 A1 | 2/2004 | Ryan | |
| 2004/0115473 A1 | 6/2004 | Burroughes et al. | |
| 2004/0187911 A1 * | 9/2004 | Gaudiana et al. | 136/252 |
| 2004/0194821 A1 | 10/2004 | Chittibabu et al. | |
| 2004/0233502 A1 * | 11/2004 | Brabec et al. | 359/275 |
| 2005/0019414 A1 | 1/2005 | Chittibabu et al. | |
| 2006/0292736 A1 * | 12/2006 | Lee et al. | 438/73 |

FOREIGN PATENT DOCUMENTS

| | | |
|---|---|---|
| DE | 19935527 A | 2/2001 |
| DE | 10140991 A | 3/2003 |
| GB | 2320356 | 6/1998 |
| JP | 02-266999 A | 10/1990 |
| JP | 2001-338273 A | 12/2001 |

* cited by examiner

US 7,522,329 B2

DISPLAYS WITH INTEGRATED PHOTOVOLTAIC CELLS

CROSS REFERENCE TO RELATED APPLICATIONS

This application claims priority to U.S. Provisional Application Ser. No. 60/710,183, filed Aug. 22, 2005, and U.S. Provisional Application Ser. No. 60/722,885, filed Sep. 30, 2005. The contents of both provisional applications are hereby incorporated by reference.

TECHNICAL FIELD

This invention relates to displays with integrated photovoltaic cells, as well as related systems, components, and methods.

BACKGROUND

Photovoltaic cells are commonly used to convert energy in the form of light into energy in the form of electricity. A typical photovoltaic cell includes a photoactive material disposed between two electrodes. Generally, light passes through one or both of the electrodes to interact with the photoactive material to convert light energy into electricity energy.

SUMMARY

In one aspect, the invention features an article that includes a substrate, a photovoltaic cell supported by the substrate, and a display supported by and operably connected to the photovoltaic cell. The display is transparent or semitransparent when the display is not electrically activated, and the display is non-transparent when the display is electrically activated.

In another aspect, the invention features an article that includes a substrate, a photovoltaic cell supported by the substrate, and a display supported by and operably connected to the photovoltaic cell. The display is transparent or semi-transparent when the display is in a first state, and the display is non-transparent when the display is in a second state.

In still another aspect, the invention features a method that includes operating a display under a first set of conditions where the display is transparent or semi-transparent, and operating the display under a second set of conditions where the display is non-transparent. The display is powered by at least one photovoltaic cell.

Embodiments can include one or more of the following aspects.

The article can be flexible.

The article can have a thickness of at most about 5 mm.

The display can include at least a portion of advertisement, paper, a business card, a magazine, or a book. In some embodiments, the display can be configured to show a fixed picture, an animated picture, signage, a pattern, text, or a logo. In other embodiments, the display can be configured to show an animated picture, signage, pattern, text, or logo.

The display can include a passive matrix.

The display can include an electrophoretic display or an electrochromic display.

The display can be disposed on the photovoltaic cell. In some embodiments, the photovoltaic cell can be disposed on the display.

The photovoltaic cell can include a photoactive layer. In some embodiments, the photoactive layer can include an electron donor material and an electron acceptor material.

The electron acceptor material can include a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. In some embodiments, the electron acceptor material can include a substituted fullerene.

The electron donor material can include a material selected from the group consisting of discotic liquid crystals, polythiophenes, polyphenylenes, polyphenylvinylenes, polysilanes, polythienylvinylenes, and polyisothianaphthalenes. In some embodiments, the electron donor material can include poly(3-hexylthiophene).

The photovoltaic cell can further include two electrodes. In some embodiments, the photovoltaic cell can further include a hole blocking layer or a hole carrier layer between the photoactive layer and one of the two electrodes.

The hole blocking layer can include a material selected from the group consisting of LiF, metal oxides and combinations thereof.

The hole carrier layer can include a material selected from the group consisting of polythiophenes, polyanilines, polyvinylcarbazoles, polyphenylenes, polyphenylvinylenes, polysilanes, polythienylenevinylenes, polyisothianaphthanenes and combinations thereof.

The first and second states can be both electrical states. In some embodiments, changing the electrical state of the display can change the display from being transparent or semi-transparent to being non-transparent. In some embodiments, changing the electrical state of the display can change the display from being non-transparent to being transparent or semi-transparent.

The article can be so configured that it does not require an additional power supply or electronic device for the operation of the display.

Embodiments can provide one or more the following advantages.

In embodiments where the articles are used in items having a short lifetime (i.e., magazines or newspapers), the articles can have a relative short operational lifetime (e.g., a few hours or days) and/or a relative short shelf lifetime (e.g., a month).

Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
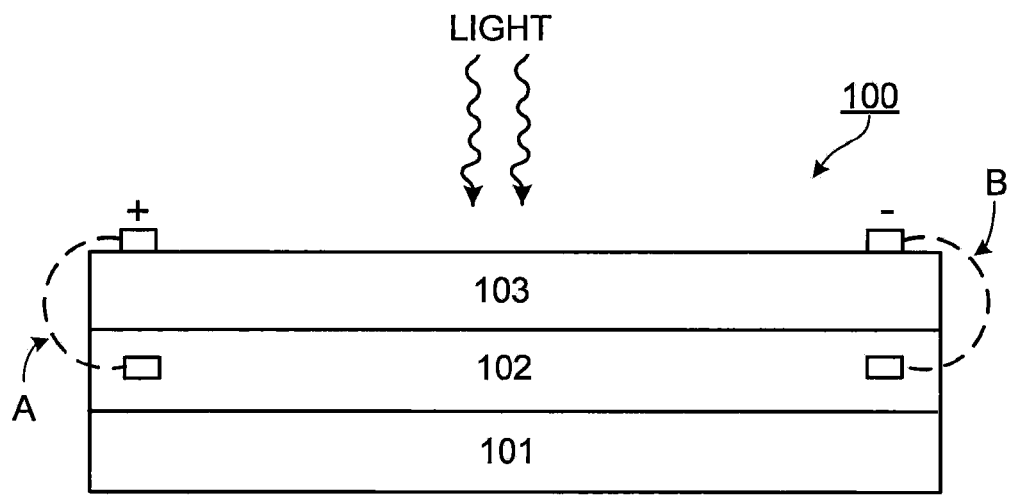
FIG. 1 is a cross-sectional view of an article having a photovoltaic cell disposed on a display.

In general, this disclosure relates to displays with integrated photovoltaic cells. FIG. 1 shows an article 100 having a substrate 101, a display 102, and a photovoltaic cell 103. Photovoltaic cell 103 is disposed on display 102, which in turn is disposed on substrate 101. Photovoltaic cell 103 and display 102 are operably connected via electrical connections A and B. As shown in FIG. 1, light (e.g., indoor light, outdoor light) impinges on photovoltaic cell 103, which creates an electrical current that is communicated to display 102 via connections A and B. This, in turn, causes display 102 to become activated. While shown in FIG. 1 as impinging on photovoltaic cell 103, in some embodiments, light can impinge on substrate 101. In certain embodiments, light can impinge on both substrate 101 and photovoltaic cell 103.

Figure 2:
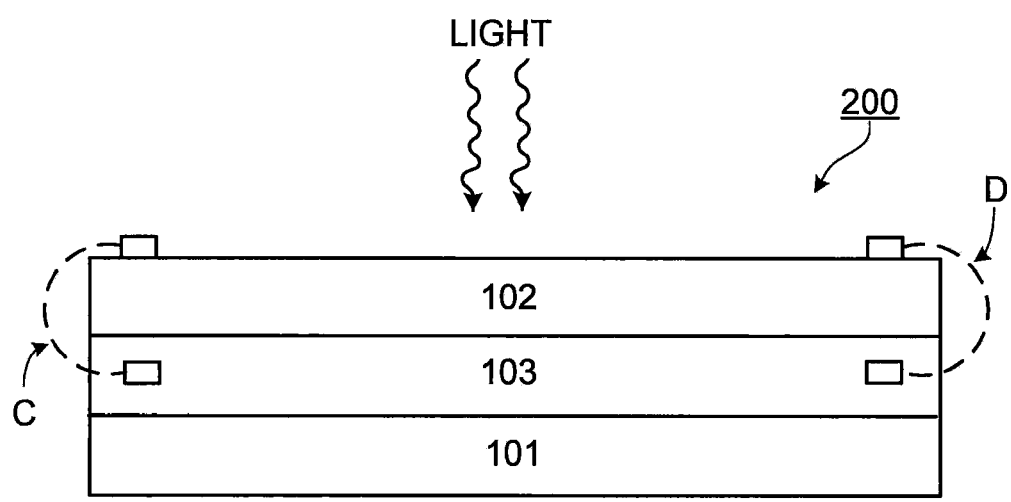
FIG. 2 is a cross-sectional view of an article having a display disposed on a photovoltaic cell.

FIG. 2 shows an article 200 having substrate 101, a display 102, and photovoltaic cell 103 configured so that display 102 is disposed on photovoltaic cell 103, which in turn is disposed on substrate 101. In article 200, photovoltaic cell 103 and display 102 are operably connected via electrical connections C and D. As shown in FIG. 2, light (e.g., indoor light, outdoor light) impinges on display 102. At least some of the light passes through display 102, and impinges on photovoltaic cell 103, creating an electrical current that is communicated to display 102 via connections C and D. This, in turn, causes display 102 to become activated. While shown in FIG. 2 as impinging first on display 102, in some embodiments of article 200, light can impinge on substrate 101 of article 200 before impinging on photovoltaic cell 200. In certain embodiments of article 200, light can impinge on both substrate 101 and display 102 before impinging on photovoltaic cell 103.

In general, display 102 can be formed of suitable materials known in the art. In article 100, display 102 can generally be formed of a non-transparent material, a semi-transparent material or a transparent material. In article 200, display 102 is typically formed of a semi-transparent material or a transparent material. In certain embodiments, display 102 can be colored or tinted. In some embodiments, display 102 can be designed, patterned, striped or illustrated. Combinations of these options can be used. In certain embodiments, different regions of display 102 can be formed of different materials.

In certain embodiments, display 102 can include a passive matrix. In some embodiments, display 102 can include an electrophoretic display or an electrochromic display. In embodiments shown in FIG. 1, display 102 can be configured to show, for example, a fixed picture, an animated picture, signage, a pattern, text, or a logo.

In some embodiments, article 100 includes a plurality of displays 102 and a plurality of photovoltaic cells 103.

Typically, article 100 is at least about one micron (e.g., at least about five microns, at least about 10 microns) thick and/or at most about 5,000 microns (e.g., at most about 1,000 microns, at most about 500 microns thick, at most about 300 microns thick, at most about 200 microns thick, at most about 100 microns, at most about 50 microns) thick. In some embodiments, article 100 can be used as a portion of advertisement, paper, a business card, a journal, a magazine, or a book. In certain embodiments, article 100 does not require an additional power supply (e.g., a battery) or another electronic device (e.g., a transistor).

Figure 3:
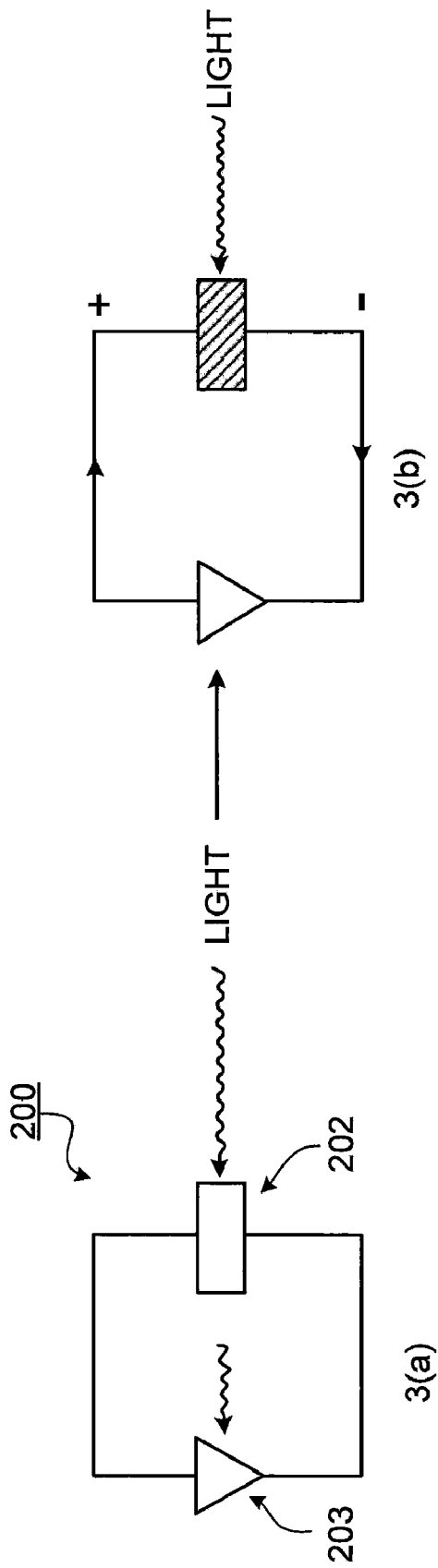
FIG. 3 is a schematic illustration of an article having an animated or blinking display.
Figure 3:
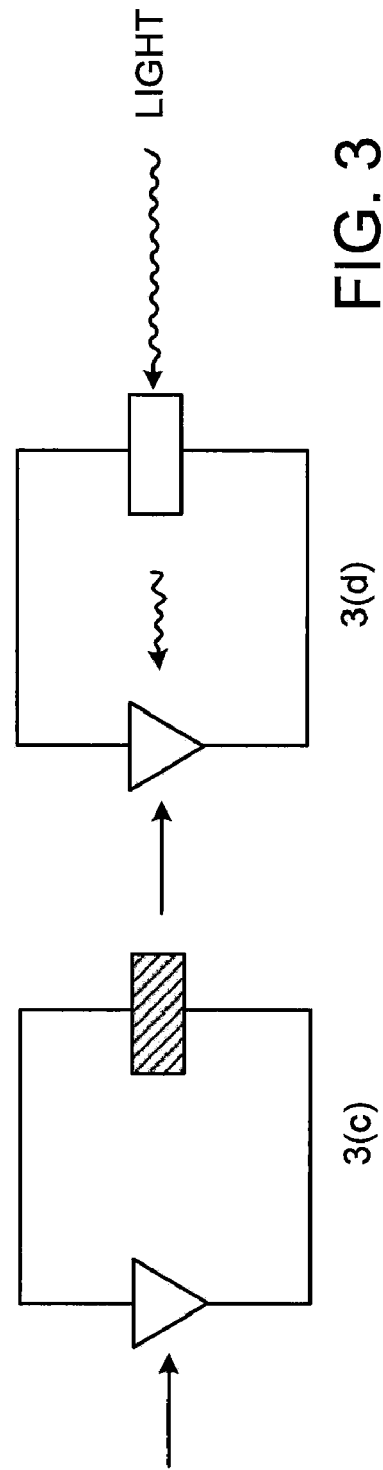

FIG. 3 is a schematic illustration of an article 200 shown in FIG. 2 having an animated or blinking display 202 with integrated photovoltaic cell 203. In embodiments shown in FIG. 3, display 202 is formed of a semitransparent material or a transparent material that is capable of being transformed into a non-transparent material upon activation by electricity. As shown in FIG. 3(a), light passes semitransparent or transparent display 202 and enters photovoltaic cell 203. As shown in FIG. 3(b), photovoltaic cell 203 can then convert solar energy to electricity, which is transported to display 202. Upon activation by electricity, display 202 becomes non-transparent. As shown in FIG. 3(c), the non-transparent display 202 blocks light from reaching photovoltaic cell 203, which consequently stops generating electricity. As shown in FIG. 3(d), when no electricity is transported to the non-transparent display 202, display 202 becomes semitransparent or transparent again. This cycle can repeat itself because once display 202 allows light to pass, photovoltaic cell 203 can again be activated and generate electricity. This cycle can provide the effect of animation or blinking. In some embodiments, article 200 does not require an additional power supply (e.g., a battery) or an additional electronic device (e.g., a transistor) for animation or blinking.

In some embodiments, substrate 101 can be formed of a non-transparent material, a semitransparent material or a transparent material. As referred to herein, a transparent material is a material which, at the thickness used in article 100, transmits at least about 60% (e.g., at least about 70%, at least about 75%, at least about 80%, at least about 85%) of incident light at a wavelength or a range of wavelengths used during operation. An exemplary wavelength or range of wavelengths occurs between about 300 nanometers and about 850 nanometers. A non-transparent material is a material which, at the thickness used in article 100, transmits at most about 20% (e.g., at most about 15%, at most about 10%, at most about 5%, at most about 1%) of incident light at a wavelength of a range of wavelengths used during operation. A semi-transparent material is a material which, at the thickness used in article 100, transmits an amount of incident light between that transmitted by a transparent material and that transmitted by a non-transparent material. Exemplary materials from which substrate 101 can be formed include polyethylene terephthalates, polyimides, polyethylene naphthalates, polymeric hydrocarbons, cellulosic polymers, polycarbonates, polyamides, polyethers and polyether ketones. In certain embodiments, the polymer can be a fluorinated polymer. In some embodiments, combinations of polymeric materials are used. In certain embodiments, different regions of substrate 101 can be formed of different materials.

In general, substrate 101 can be flexible, semi-rigid, or rigid (e.g., glass). In some embodiments, substrate 101 has a flexural modulus of less than about 5,000 megaPascals (e.g., less than about 2,500 megaPascals, less than about 1,000 megaPascals). In certain embodiments, different regions of substrate 101 can be flexible, semi-rigid, or inflexible (e.g., one or more regions flexible and one or more different regions semi-rigid, one or more regions flexible and one or more different regions inflexible). In some embodiments, all of substrate 101, display 102, and photovoltaic cell 103 are formed of flexible materials.

Typically, substrate 101 is at least about one micron (e.g., at least about five microns, at least about 10 microns) thick and/or at most about 5,000 microns (e.g., at most about 1,000 microns, at most about 500 microns thick, at most about 300 microns thick, at most about 200 microns thick, at most about 100 microns, at most about 50 microns) thick.

Generally, substrate 101 can be colored or non-colored. In some embodiments, one or more portions of substrate 101 is/are colored while one or more different portions of substrate 101 is/are non-colored.

In general photovoltaic cell 103 can be any suitable photovoltaic cell, such as an organic photovoltaic cell, a dye sensitized photovoltaic cell, or a hybrid photovoltaic cell. Other examples of such photovoltaic cells include photoactive cells with an photoactive material formed of amorphous silicon, cadmium selenide, cadmium telluride, copper indium sulfide, and copper indium gallium selenide.

Figure 4:
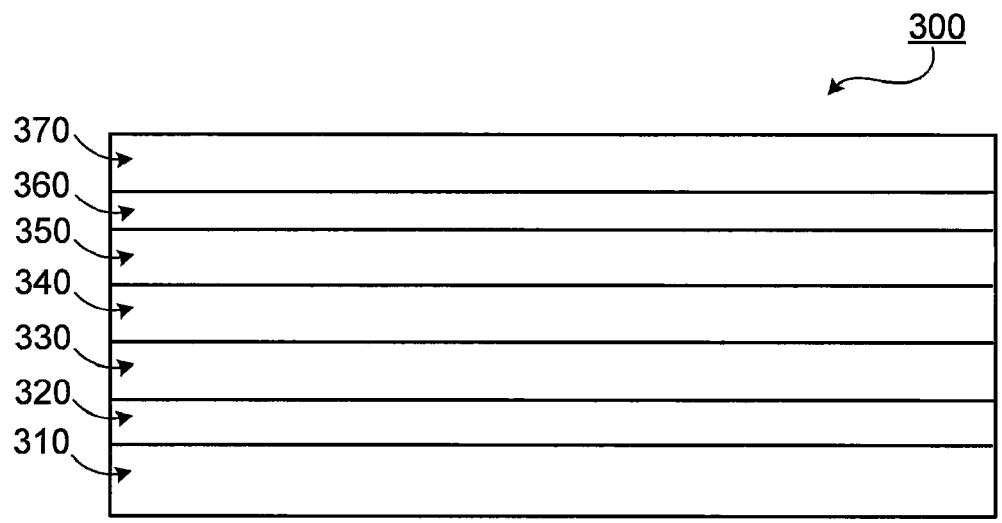
FIG. 4 is a cross-sectional view of an organic photovoltaic cell.

In some embodiments, photovoltaic cell 103 is an organic photovoltaic cell. FIG. 4 shows a cross-sectional view of an organic photovoltaic cell 300 that includes a substrate 310, a cathode 320, a hole carrier layer 330, a photoactive layer 340 (containing an electron acceptor material and an electron donor material), a hole blocking layer 350, an anode 360, and a substrate 370.

In general, during use, light impinges on the surface of substrate 310, and passes through substrate 310, cathode 320, and hole carrier layer 330. The light then interacts with photoactive layer 340, causing electrons to be transferred from the electron donor material to the electron acceptor material. The electron acceptor material then transmits the electrons through hole blocking layer 350 to anode 360, and the electron donor material transfers holes through hole carrier layer 330 to cathode 320. Anode 360 and cathode 320 are in electrical connection via an external load so that electrons pass from anode 360, through the load, and to cathode 320.

Electron acceptor materials of photoactive layer 340 can include fullerenes. In some embodiments, photoactive layer 340 can include one or more unsubstituted fullerenes and one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include C61-phenyl-butyric acid methyl ester (PCBM) and C61-phenyl-butyric acid glycidol ester (PCBG).

As used herein, the term "fullerene" means a compound, e.g., a molecule, including a three-dimensional carbon skeleton having a plurality of carbon atoms. The carbon skeleton of such fullerenes generally forms a closed shell, which may be, e.g., spherical or semi-spherical in shape. Alternatively, the carbon skeleton may form an incompletely closed shell, such as, e.g., a tubular shape. Carbon atoms of fullerenes are generally linked to three nearest neighbors in a tetrahedral network. The term "fullerene" includes both unsubstituted and substituted fullerenes.

Unsubstituted fullerenes may be designated as $C_j$, where j is an integer related to the number of carbon atoms of the carbon skeleton. For example, $C_{60}$ defines a truncated icosahedron including 32 faces, of which 12 are pentagonal and 20 are hexagonal. Other suitable fullerenes include, e.g., $C_j$ where j may be at least 50 and may be less than about 250. Unsubstituted fullerenes can generally be produced by the high temperature reaction of a carbon source, such as elemental carbon or carbon containing species. For example, sufficiently high temperatures may be created using laser vaporization, an electric arc, or a flame. Subjecting a carbon source to high temperatures forms a carbonaceous deposit from which various unsubstituted fullerenes are obtained. Typically, the unsubstituted fullerenes can be purified using a combination of solvent extraction and chromatography.

Substituted fullerenes include fullerenes containing one or more substituents, such as PCBM and PCBG Examples of suitable substituents include alkyl, alkenyl, alkynyl, cycloalkyl, cycloalkenyl, alkoxy, aryl, aryloxy, heteroaryl, heteroaryloxy, amino, alkylamino, dialkylamino, arylamino, diarylamino, hydroxyl, halogen, thio, alkylthio, arylthio, alkylsulfonyl, arylsulfonyl, cyano, nitro, acyl, acyloxy, carboxyl, and carboxylic ester. These substituents can be further substituted by one or more suitable substituents. Substituted fullerenes can be prepared by any suitable methods. For example, alkylfullerene derivatives can be prepared by reacting fullerenes with organic alkyl lithium or alkyl Grignard reagents and then with alkyl halides. As another example, PCBM can be prepared by reacting $C_{60}$ with methyl 4-benzoylbutyrate p-tosylhydrazone in the presence of a base. PCBM can be further modified to obtain other substituted fullerenes (e.g., PCBG).

Without wishing to be bound by any theory, it is believed that a photovoltaic cell containing a mixture of one or more unsubstituted fullerenes and one or more substituted fullerenes in photoactive layer 340 can exhibit enhanced thermal stability. For example, after being heated at an elevated temperature for a period of time, a photovoltaic cell containing a mixture of one or more unsubstituted fullerenes and one or more substituted fullerenes can undergo a relatively small change in efficiency.

In general, the weight ratio of the unsubstituted fullerene to the substituted fullerene can be varied as desired. In certain embodiments, the weight ratio of the unsubstituted fullerene to the substituted fullerene can be at least about 1:20 (e.g., at least about 1:10, at least about 1:5, at least about 1:3, or at least about 1:1) and/or at most about 10:1 (e.g., at most about 5:1 or at most about 3:1).

In some embodiments, the efficiency of photovoltaic cell 300 after being heated at a temperature of at least about 50° C. (e.g., at least about 100° C., at least about 150° C., at least about 170° C., at least about 200° C., at least about 225° C.) for at least about 5 minutes (e.g., at least about 10 minutes, at least about 15 minutes, at least about 20 minutes, at least about 30minutes, at least about 60 minutes, at least about 120 minutes) is at least about 50% (e.g., at least about 60%, at least about 70%, at least about 80%, at least about 90%, at least about 95%, at least about 98%) of the efficiency before being heated.

Photovoltaic cell 300 can have an efficiency of at least about 0.5% (e.g., at least about 1%, at least about 2%, at least about 3%, or at least about 4%). The efficiency of a photovoltaic cell refers to the ratio of the solar energy that reaches the cell to the electrical energy that is produced by the cell. Efficiency of a photovoltaic cell can be obtained by methods known in the art. For example, it can be determined from a current-voltage curve derived based on a photovoltaic cell. In some embodiments, the unsubstituted fullerene and the substituted fullerene in photoactive layer 140 can be substantially non-phase separated.

In some embodiments, photoactive layer 340 can include one or more non-fullerene electron acceptor materials. Examples of suitable electron acceptor materials include oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups).

Electron donor materials of photoactive layer 340 can include conducting polymers (e.g., a conjugated organic polymer), which generally have a conjugated portion. Conjugated polymers are characterized in that they have overlapping π orbitals, which contribute to the conductive properties. Conjugated polymers may also be characterized in that they can assume two or more resonance structures. The conjugated organic polymer may be, e.g., linear or branched, so long as the polymer retains its conjugated nature.

Examples of suitable electron donor materials include one or more of polyacetylene, polyaniline, polyphenylene, poly(p-phenylene vinylene), polythienylvinylene, polythiophene, polyporphyrins, porphyrinic macrocycles, polymetallocenes, polyisothianaphthalene, polyphthalocyanine, a discotic liquid crystal polymer, and a derivative or a combination thereof. Exemplary derivatives of the electron donor materials include derivatives having pendant groups, e.g., a cyclic ether, such as epoxy, oxetane, furan, or cyclohexene oxide. Derivatives of these materials may alternatively or additionally include other substituents. For example, thiophene components of electron donor may include a phenyl group, such as at the 3 position of each thiophene moiety. As another example, alkyl, alkoxy, cyano, amino, and/or hydroxy substituent groups may be present in any of the polyphenylacetylene, polydiphenylacetylene, polythiophene, and poly(p-phenylene vinylene) conjugated polymers. In some embodiments, the electron donor material is poly(3-hexylthiophene) (P3HT). In certain embodiments, photoactive layer 340 can include a combination of electron donor materials.

In some embodiments, photoactive layer 340 includes an oriented electron donor material (e.g., a liquid crystal (LC) material), an electroactive polymeric binder carrier (e.g., P3HT), and a plurality of nanocrystals (e.g., oriented nanorods including at least one of ZnO, WO$_3$, or TiO$_2$). The liquid crystal material can be, for example, a discotic nematic LC material, including a plurality of discotic mesogen units. Each unit can include a central group and a plurality of electroactive arms. The central group can include at least one aromatic ring (e.g., an anthracene group). Each electroactive arm can include a plurality of thiophene moieties and a plurality of alkyl moities. Within the photoactive layer, the units can align in layers and columns. Electroactive arms of units in adjacent columns can interdigitate with one another facilitating electron transfer between units. Also, the electroactive polymeric carrier can be distributed amongst the LC material to further facilitate electron transfer. The surface of each nanocrystal can include a plurality of electroactive surfactant groups to facilitate electron transfer from the LC material and polymeric carrier to the nanocrystals. Each surfactant group can include a plurality of thiophene groups. Each surfactant can be bound to the nanocrystal via, for example, a phosphonic end-group. Each surfactant group also can include a plurality of alkyl moieties to enhance solubility of the nanocrystals in the photoactive layer.

Other electron donor materials and electron acceptor materials are disclosed in co-pending application U.S. patent application Ser. No. 11/486,536, filed Jul. 14, 2006, the contents of which are hereby incorporated by reference.

Turning now to other components of photovoltaic cell 300, substrate 310 and substrate 370 can be the same as or different from substrate 101 or 201 described above. In some embodiments, when photovoltaic cell 300 is used in an article describe above, one or both of substrates 310 and 370 can be removed or integrated into the substrate or the display in the article.

Either or both of cathode 320 and anode 360 may be configured to transmit at least a portion of light impinging thereon. For example, at least one of cathode 320 and anode 360 may be formed of a transparent material. An exemplary transparent material includes a transparent oxide, such as a tin oxide, e.g., indium-doped tin oxide (ITO). As an alternative to or in conjunction with a transparent material, cathode 320 may be configured with open areas to allow light to pass through and closed areas defined by a conductive material that conducts electrons. In one embodiment, at least one of cathode 320 and anode 360 is a mesh. Photovoltaic cells having mesh electrodes are disclosed, for example, in co-pending and commonly owned U.S. Utility Applications 10/395,823, 10/723,554, and 10/494,560, each of which is hereby incorporated by reference.

Hole carrier layer 330 is generally formed of a material that, at the thickness used in photovoltaic cell 300, transports holes to electrode 320 and substantially blocks the transport of electrons to electrode 320. Examples of materials from which hole carrier layer 330 can be formed include polythiophenes (e.g., poly(3,4-ethylenedioxythiophene)), polyanilines, polyvinylcarbazoles, polyphenylenes, polyphenylvinylenes, polysilanes, polythienylenevinylenes and/or polyisothianaphthanenes. In some embodiments, hole carrier layer 330 can include combinations of hole carrier materials.

In general, the distance between the upper surface of hole carrier layer 330 (i.e., the surface of hole carrier layer 330 in contact with photoactive layer 340) and the upper surface of electrode 320 (i.e., the surface of electrode 320 in contact with hole carrier layer 330) can be varied as desired. Typically, the distance between the upper surface of hole carrier layer 330 and the upper surface of electrode 320 is at least 0.01 micron (e.g., at least about 0.05 micron, at least about 0.1 micron, at least about 0.2 micron, at least about 0.3 micron, or at least about 0.5 micron) and/or at most about 5 microns (e.g., at most about 3 microns, at most about 2 microns, or at most about 1 micron). In some embodiments, the distance between the upper surface of hole carrier layer 330 and the upper surface of electrode 320 is from about 0.01 micron to about 0.5 micron.

Generally, photoactive layer 340 is sufficiently thick to be relatively efficient at absorbing photons impinging thereon to form corresponding electrons and holes, and sufficiently thin to be relatively efficient at transporting the holes and electrons to electrodes of the device. In certain embodiments, photoactive layer 340 is at least 0.05 micron (e.g., at least about 0.1 micron, at least about 0.2 micron, or at least about 0.3 micron) thick and/or at most about 1 micron (e.g., at most about 0.5 micron or at most about 0.4 micron) thick. In some embodiments, photoactive layer 340 is from about 0.1 micron to about 0.2 micron thick.

Hole blocking layer 350 is generally formed of a material that, at the thickness used in photovoltaic cell 300, transports electrons to anode 360 and substantially blocks the transport of holes to anode 360. Examples of materials from which hole blocking layer 350 can be formed include LiF and metal oxides (e.g., zinc oxide, titanium oxide).

Typically, hole blocking layer 350 is at least 0.02 micron (e.g., at least about 0.03 micron, at least about 0.04 micron, or at least about 0.05 micron) thick and/or at most about 0.5 micron (e.g., at most about 0.4 micron, at most about 0.3 micron, at most about 0.2 micron, or at most about 0.1 micron) thick.

In some embodiments, a photovoltaic cell can be prepared as follows. Anode 360 is formed on substrate 370 using conventional techniques, and hole-blocking layer 350 is formed on anode 360 (e.g., using a vacuum deposition process or a solution coating process). Photoactive layer 340 is formed on hole-blocking layer 350 using a suitable process, such as, ink jet printing, spin coating, dip coating, knife coating, bar coating, spray coating, roller coating, slot coating, gravure coating, or screen printing. Hole carrier layer 330 is formed on photoactive layer 340 using, for example, a solution coating process. Cathode 320 is partially disposed in hole carrier layer 330 (e.g., by disposing cathode 320 on the surface of hole carrier layer 330, and pressing cathode 320). Substrate 310 is then formed on cathode 320 and hole carrier layer 330 using conventional methods.

Figure 5:
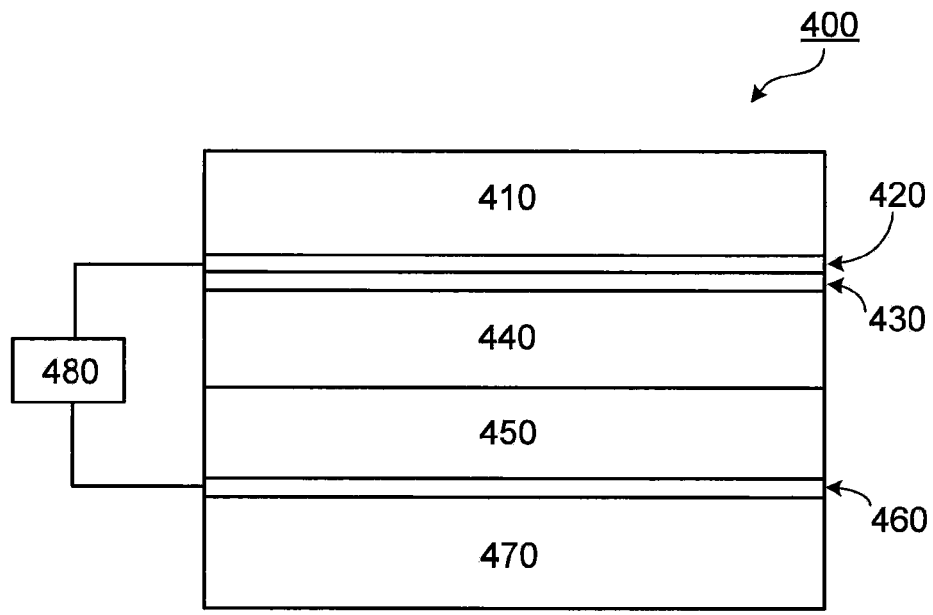
FIG. 5 is a cross-sectional view of a dye sensitized solar cell.

In some embodiments, the stamping methods described above can be used to print an electrode on a substrate for use in a DSSC. FIG. 5 is a cross-sectional view of DSSC 400 that includes a substrate 410, an electrode 420, a catalyst layer 430, a charge carrier layer 440, a photoactive layer 450, an electrode 460, a substrate 470, and an external load 480. Examples of DSSCs are discussed in U.S. patent application Ser. Nos. 11/311,805 filed Dec. 19, 2005 and 11/269,956 filed on Nov. 9, 2005, the contents of which are hereby incorporated by reference.

Figure 6:
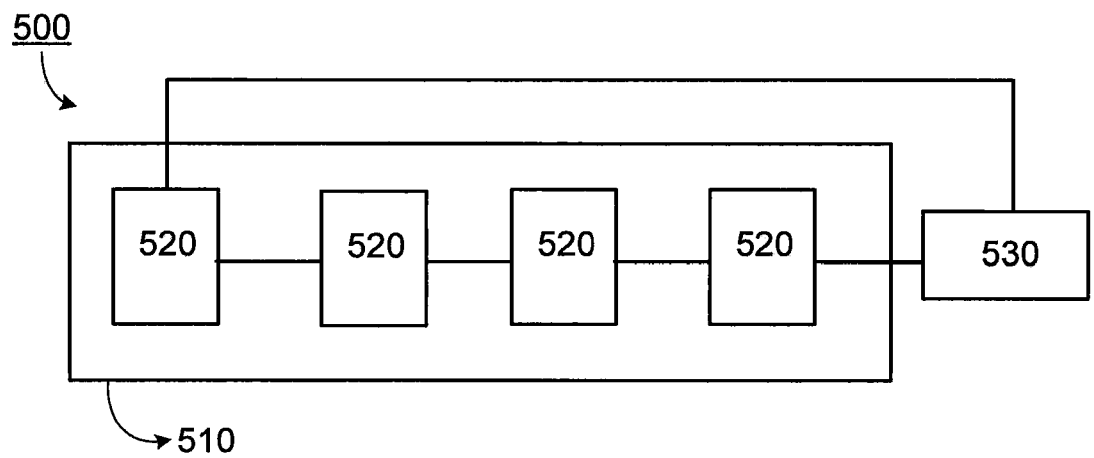
FIG. 6 is a schematic of a system containing multiple photovoltaic cells electrically connected in series.
Figure 7:
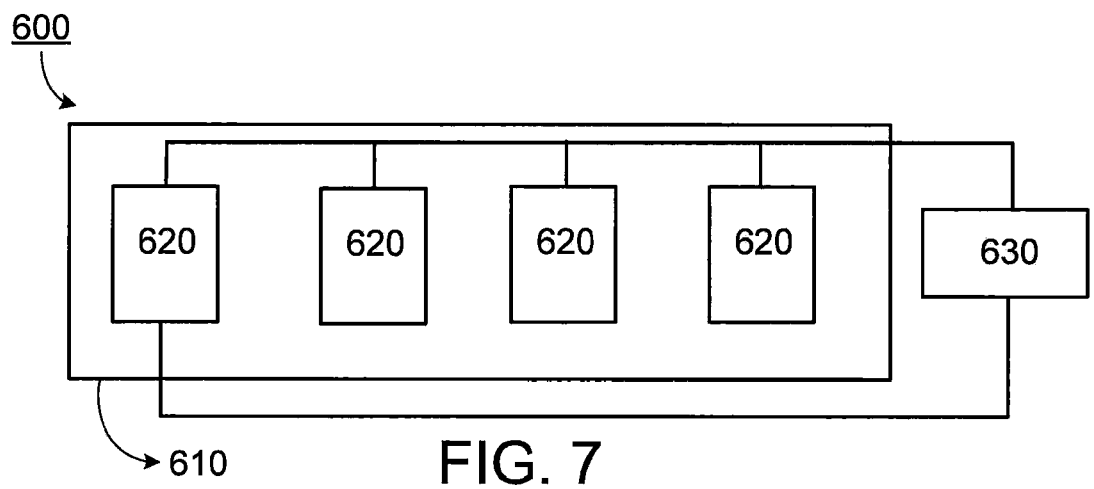
FIG. 7 is a schematic of a system containing multiple photovoltaic cells electrically connected in parallel.

While embodiments have been described in which a photovoltaic cell used to power the display in an article, in some embodiments a photovoltaic module that includes a plurality of photovoltaic cells, at least some of which are electrically connected, can be used. As an example, FIG. 6 is a schematic of a photovoltaic system 500 having a module 510 containing photovoltaic cells 520. Cells 520 are electrically connected in series, and system 500 is electrically connected to a load 530. As another example, FIG. 7 is a schematic of a photovoltaic system 600 having a module 610 that contains photovoltaic cells 620. Cells 620 are electrically connected in parallel, and system 600 is electrically connected to a load 630. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

Other embodiments are in the claims.

What is claimed is:

1. An article, comprising:
   a substrate;
   a photovoltaic cell supported by the substrate; and
   a display between the substrate and the photovoltaic cell,
   wherein the article is configured so that:
      when the display is transparent or semitransparent, light can pass through the display so that the light interacts with the photovoltaic device to generate electricity;
      electricity generated by the photovoltaic cell can be transported to the display to make the display non-transparent to the light; and
      when the display is non-transparent, the display blocks the light from reaching the photovoltaic device to stop the photovoltaic device from generating electricity.

2. The article of claim 1, wherein the article is flexible.

3. The article of claim 1, wherein the article has a thickness of at most about 5 mm.

4. The article of claim 1, wherein the display comprises at least a portion of advertisement, paper, a business card, a magazine, or a book.

5. The article of claim 1, wherein the display is configured to show a fixed picture, signage, pattern, text, or logo.

6. The article of claim 1, wherein the display is configured to show an animated picture, signage, pattern, text, or logo.

7. The article of claim 1, wherein the display comprises a passive matrix.

8. The article of claim 1, wherein the display comprises an electrophoretic display or an electrochromic display.

9. The article of claim 1, wherein the photoactive layer comprises an electron donor material and an electron acceptor material.

10. The article of claim 9, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

11. The article of claim 10, wherein the electron acceptor material comprises a substituted fullerene.

12. The article of claim 9, wherein the electron donor material comprises a material selected from the group consisting of discotic liquid crystals, polythiophenes, polyphenylenes, polyphenylvinylenes, polysilanes, polythienylvinylenes, and polyisothianaphthalenes.

13. The article of claim 9, wherein the electron donor material comprises poly(3-hexylthiophene).

14. The article of claim 1, wherein the photovoltaic cell further comprises a hole blocking layer between the photoactive layer and one of the two electrodes.

15. The article of claim 14, wherein the hole blocking layer comprises a material selected from the group consisting of LiF, metal oxides and combinations thereof.

16. The article of claim 1, wherein the photovoltaic cell further comprises a hole carrier layer between the photoactive layer and one of the two electrodes.

17. The article of claim 16, wherein the hole carrier layer comprises a material selected from the group consisting of polythiophenes, polyanilines, polyvinylcarbazoles, polyphenylenes, polyphenylvinylenes, polysilanes, polythienylenevinylenes, polyisothianaphthanenes and combinations thereof.

18. The article of claim 1, wherein the article is so configured that it does not require an additional power supply or electronic device for the operation of the display.

19. The article of claim 1, wherein the article is configured so that, during use, the display blinks.

20. The article of claim 1, wherein changing the electrical state of the display during use of the article causes the display to blink.

21. A method, comprising:
   a) providing an article including a display and a photovoltaic device;
   b) passing light through the display so that the light interacts with the photovoltaic device to generate electricity;
   c) transporting the electricity to the display to make the display non-transparent to the light; and
   d) using the non-transparent display to block the light from reaching the photovoltaic device so that the photovoltaic device stops generating electricity.

22. The method of claim 21, wherein changing the electrical state of the display changes the display from being transparent or semi-transparent to being non-transparent.

23. The method of claim 22, wherein changing the electrical state of the display changes the display from being non-transparent to being transparent or semi-transparent.

24. The method of claim 21, wherein changing the electrical state of the display changes the display from being non-transparent to being transparent or semi-transparent.

25. The article of claim 21, wherein the article is so configured that it does not require an additional power supply or electronic device for the operation of the display.

26. The method of claim 21, wherein the display blinks during operation.

27. The method of claim 21, wherein changing the electrical state of the display causes the display to blink.

28. The method of claim 21, further comprising:
   e) stopping the transport of electricity from the photovoltaic device to the display so that the display becomes transparent or semi-transparent to the light.

29. The method of claim 28, further comprising:
   f) passing light through the display so that the light interacts with the photovoltaic device to provide electricity; and
   g) transporting the electricity to the display to make the display non-transparent to the light.

30. The method of claim 21, wherein the method causes the display to blink.

* * * * *

UNITED STATES PATENT AND TRADEMARK OFFICE
CERTIFICATE OF CORRECTION

PATENT NO. : 7,522,329 B2  Page 1 of 1
APPLICATION NO. : 11/508035
DATED : April 21, 2009
INVENTOR(S) : Christoph Brabec It is certified that error appears in the above-identified patent and that said Letters Patent is hereby corrected as shown below:

Title page, col. 1, section (73), add a second Assignee -- Leonard Kurz GmbH & Co. KG --.

Signed and Sealed this

Fourteenth Day of July, 2009

JOHN DOLL
*Acting Director of the United States Patent and Trademark Office*